Aug. 17, 1965 E. A. TROJAK 3,201,718
FREQUENCY MODULATION CIRCUIT
Filed July 2, 1962
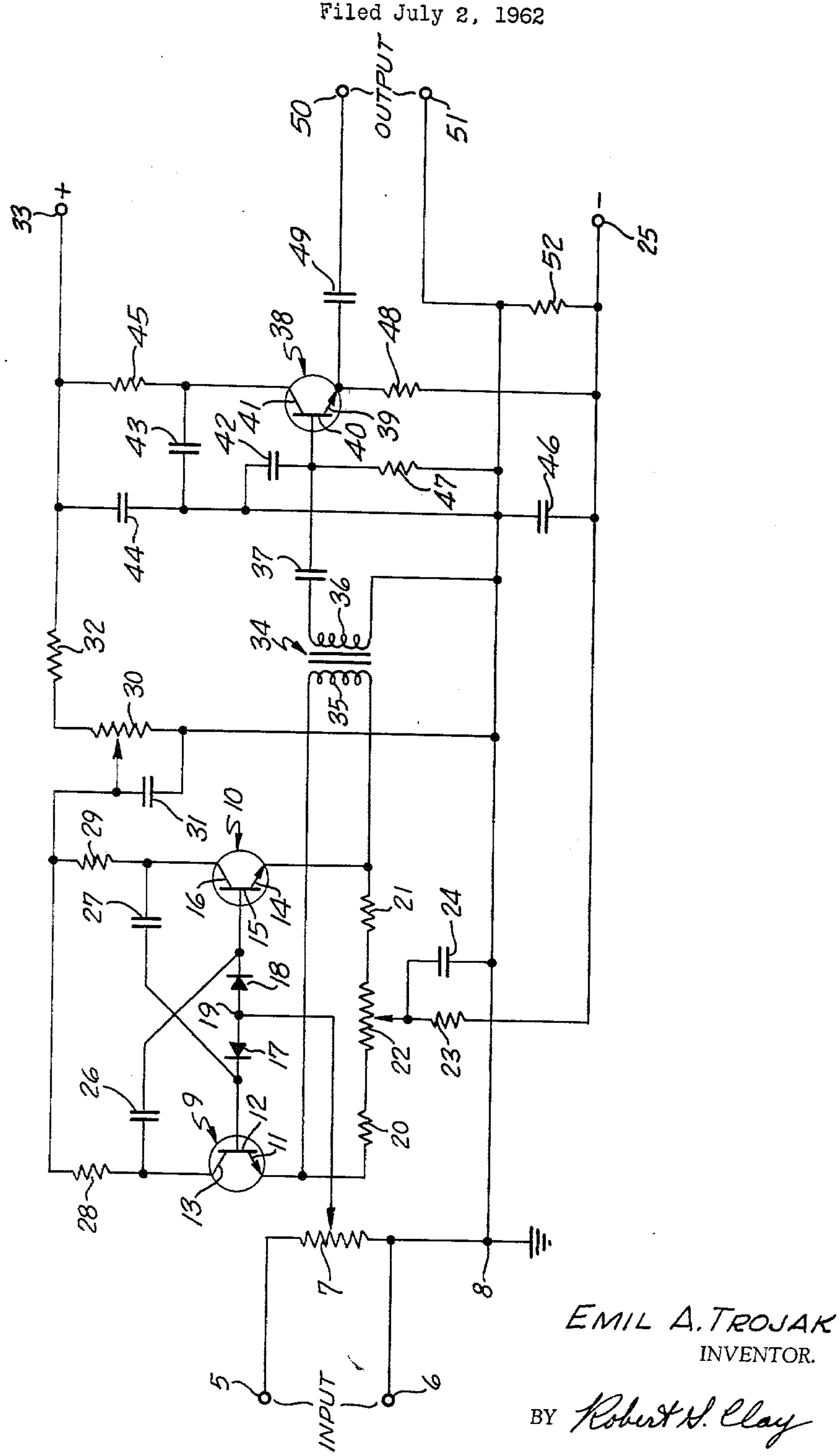
EMIL A. TROJAK
INVENTOR.
BY Robert S. Clay
ATTORNEY United States Patent Office 3,201,718
Patented Aug. 17, 1965

3,201,718
FREQUENCY MODULATION CIRCUIT

Emil A. Trojak, Palo Alto, Calif., assignor to Ampex Corporation, Redwood City, Calif., a corporation of California Filed July 2, 1962, Ser. No. 206,928
2 Claims. (Cl. 332—16)

This invention relates to frequency modulated signal generators, and more particularly to frequency modulated signal generators capable of large frequency deviation for low voltage modulation signals and responsive to modulation frequencies approaching direct current.

For recording of television signals on magnetic tape, a frequency modulated (FM) generator may be considered to be an oscillation generator that responds to a varying amplitude input signal by changing its frequency of oscillation accordingly. An astable or free-running multivibrator circuit that is arranged to operate at a frequency dependent upon an input signal amplitude has been found to provide a practical basis for FM signal generators.

In prior multivibrator-type frequency modulators used for magnetic tape recording, input signals have been indirectly coupled, as by capacitors, to the amplifying devices of the multivibrator circuits. Frequency modulators utilizing indirect coupling means to couple the input signals to the amplifying devices of the multivibrator circuits have certain disadvantages and drawbacks, such as lack of response to modulation frequencies approaching direct current. Furthermore, the modulating circuit was not capable of sensing low voltage modulating signals. Thus, in summary, prior FM signal generators, which utilized coupling capacitors to couple indirectly the input signals, were unsatisfactory for certain applications because they were not responsive to low modulation frequencies and were not capable of large frequency deviation for low voltage modulating signals.

It is, therefore, the principal aim of this invention to provide a simple and inexpensive way to eliminate the disadvantages and drawbacks of prior frequency modulated signal generators used in recording television signals on magnetic tape. This is accomplished by the present invention by providing direct coupling means for coupling the input signals to the control elements of the amplifier devices of the multivibrator circuit. In one specific arrangement in accordance with the invention, a pair of semiconductor diodes is used to couple directly an input signal to the bases of two cross-coupled transistors. The diodes, which are connected back-to-back, have an intermediate junction point to which the single-sided input signal is applied. The input signal, therefore, can be directly coupled to the bases of the cross-coupled transistors through the semiconductor diodes although some sort of attenuating device would ordinarily be employed before the signal is applied to the multivibrator. The diodes are forward biased into conduction by the base-to-emitter currents of the transistors. The video signal varies the transistor base currents which cause the instantaneous carrier ferquency to change. Since the diodes are connected back-to-back between the bases of the transistors, they do not affect the time constants of the multivibrator circuit. Accordingly, the unique and novel arrangement of the present invention provides a very desirable frequency modulated signal generator for recording television signals on magnetic tape.

It is, therefore, the main aim of this invention to provide a simple and inexpensive way of improving prior frequency modulated signal generators.

Another object of this invention is to provide a frequency modulated signal generator that responds to modulation frequencies approaching direct current.

A further object of this invention is to provide a frequency modulating circuit that is capable of large frequency deviation for low voltage modulating signals.

Other objects and advantages of the invention will become apparent from the following detailed description of a preferred embodiment of the invention when taken with the drawing which shows in the sole figure a schematic diagram of the preferred embodiment of the invention.

Referring to the sole figure, a frequency modulated signal generator including an oscillation generator having the general form of a multivibrator is frequency controlled by a video signal connected across input terminals 5 and 6. A voltage divider 7, may be connected across the input terminals 5 and 6 if it is desired to vary the modulation level. The amplifying devices, which comprise the principal operating elements of the multivibrator, are NPN conductivity type transistors 9 and 10. Transistor 9 consists of an emitter 11, a base 12 and a collector 13, while transistor 10 consists of an emitter 14, a base 15 and a collector 16. It is not my intention to limit transistors 9 and 10 to NPN conductivity type but PNP conductivity type transistors may also be used.

In accordance with the present invention, direct coupling of the input signal is accomplished by interconnecting the single-sided input terminal 5 and the bases 12 and 15 of transistors 9 and 10 through a pair of semiconductor diodes 17 and 18. The cathode of diode 17 is connected to base 12 while the cathode of diode 18 is connected to the base 15. The anodes of diodes 17 and 18 are connected together, at junction point 19. The diodes 17 and 18 are thus connected back-to-back so that they are oppositely poled with respect to junction point 19 between them. The video input signal across terminals 5 and 6 is applied to junction point 19 through the adjustable arm of voltage divider 7. With this arrangement, the input signal across terminals 5 and 6 is directly coupled to the bases 12 and 15 of the transistors 9 and 10 through semiconductor diodes 17 and 18. A first battery connected between ground 8 and negative potential 25 provides forward biasing for the semiconductor diodes 17 and 18. The diodes 17 and 18, therefore, are forward biased into conduction by the base-to-emitter currents of the transistors 9 and 10. The time constants of the multivibrator circuit are not affected by the diodes 17 and 18, since they are connected back-to-back between the bases 12 and 15 of the transistors 9 and 10.

The emitters 11 and 14 of transistors 9 and 10 are connected to a resistor network consisting of resistors 20 and 21 and voltage divider 22. The adjustable arm of the voltage divider 22 is adjusted to set symmetry control. This allows symmetrical pulses to be obtained if there happens to be non-uniformity of the diodes, resistors, capacitors and transistors in the circuit. The arm of the voltage divider 22 is connected to the negative potential 25 through a parallel network consisting of a resistor 23 and a capacitor 24. The first battery, which is connected between ground 8 and negative potential 25, provides base biases for transistors 9 and 10 and forward biasing for the diodes 17 and 18. The diodes 17 and 18 are forward biased into conduction by the base-to-emitter currents of the transistors 9 and 10 and alternately reverse biased at the natural frequency or carrier rate.

The cross couplings, which characterize the multivibrator type of circuit, are provided by a pair of capacitors 26 and 27, each of which couples the base of one of the transistors 9 and 10 to the collector of the other. Capacitor 26 is connected between the collector 13 and the base 15 while capacitor 27 is connected between collector 16 and base 12. The collectors 13 and 16 of transistors 9 and 10 are connected to a voltage divider 30 through a pair of resistors 28 and 29. Capacitor 31 is connected across the arm and one side of the voltage divider 30 or ground 8. The other side of the voltage divider 30 is connected to the positive potential 33 of a second battery through resistor 32. The second battery, which is connected between positive potential 33 and ground 8, provides proper biasing for transistors 9 and 10. The voltage divider 30 is adjusted to set the operating frequency of the carrier.

An output circuit is arranged to eliminate in-phase components appearing at the emitters 11 and 14 of transistors 9 and 10. The emitters 11 and 14, which constitute the output circuit of the multivibrator circuit, are coupled to the primary winding 35 of step-up transformer 34 that provides a push-pull output and minimizes video feed-through because most of the in-phase video components cancel each other. The secondary winding 36 of transformer 34 is connected to the base 40 of an emitter follower transistor 38 through coupling capacitor 37. The emitter follower transistor 38 converts the high impedance input at the secondary winding 36 of the transformer 34 to a low impedance output at output terminals 50 and 51. The collector 41 of transistor 38 is directly connected to positive potential 33 of the second battery through resistor 45 and to ground 8 through by-pass capacitor 43. Capacitor 42 is connected from the base 40 to ground 8. Capacitors 44 and 46 are radio frequency by-pass capacitors for the supply batteries 25 and 33. Base 40 of the transistor 38 is connected to ground 8 through resistor 47. Output terminal 50 is connected to the emitter 39 through coupling capacitor 49. A bleeder resistor 52 is connected between terminal 51 and negative potential 25. The frequency modulated signal is taken across output terminals 50 and 51.

In operation, the circuit generates an operating frequency that is determined by the time constants of the coupled passive circuits consisting of resistors 28 and 29 plus a part of the voltage divider resistor 30 taken together with the cross-connected capacitors 26 and 27. The back-to-back diodes 17 and 18 do not affect the time constants of the multivibrator circuit. In well known fashion, one of the transistors 9 and 10 may conduct while the other is cut off, the interval during which this state is maintained being determined by the time required for one of the cross-coupled capacitors 26 and 27 to discharge past a given level. Regenerative feedback between the two transistors 9 and 10 causes the transistors 9 and 10 to switch states of conduction with controlled periodicity. The video input signal across terminals 5 and 6 varies the base currents of transistors 9 and 10 to cause the instantaneous carrier frequency to change. The output signal of the multivibrator circuit appears across the emitters 11 and 14 of the transistors 9 and 10 and is approximately sinusoidal. The step-up transformer couples the output signal from the multivibrator circuit to the emitter follower transistor 38, which acts as an impedance converter. The frequency modulated output signal appears across the output terminals 50 and 51.

As previously mentioned, the video input signal is directly coupled to the bases 12 and 15 of transistors 9 and 10 through semiconductor diodes 17 and 18. The negative potential 25 of the first battery forward biases the semiconductor diodes 17 and 18 through the base-to-emitter circuits of transistors 9 and 10. Because of the direct coupling of the input signal, the multivibrator circuit is very sensitive to low voltage modulating signals. By way of example, a .2 volt peak-to-peak modulating signal provides the same frequency deviation which previously required a .5 volt peak-to-peak modulating signal. With the present circuit, a total deviation of two megacycles is obtained by using .2 rather than .5 volt peak-to-peak modulating signal. Furthermore, the circuit responds to modulating frequencies approaching D.C. The advantages of the modulating circuit are made possible by direct coupling of the input signal to the multivibrator circuit through semiconductor diodes. Thus, it is seen that this frequency modulating circuit is capable of large frequency deviation for low voltage modulating signals and responsive to modulation frequencies approaching direct current.

Although the present invention has been shown and described in terms of a preferred embodiment, changes and modifications which do not depart from the inventive concepts taught herein will suggest themselves to those skilled in the art. Such changes and modifications are deemed to fall within the scope of the invention.

What is claimed is:

1. A frequency modulating circuit comprising:

a transistor multivibrator circuit including a pair of transistors with cross-coupled capacitors, said transistors each having an emitter, a base and a collector, each of said cross-coupled capacitors connected between the collector of one transistor and the base of the other transistor;

a pair of forward-biased semiconductor diodes connected between the bases of said transistors, said diodes connected in series opposition and having a junction point therebetween;

a modulating signal source connected to the junction point between said diodes, said semiconductor diodes coupling directly said modulating signal source to the bases of said transistors;

an output transformer having a primary and a secondary, the primary of said transformer connected across the emitters of said transistors; and a transistor impedance converter connected across the secondary of said transformers.

2. A frequency modulating circuit for video signals comprising:

an astable transistor multivibrator circuit including a pair of similar transistors with cross-coupled capacitors, said transistors each having an emitter, a base and a collector, each of said cross-coupled capacitors connected between the collector of one transistor and the base of the other transistor;

a pair of semiconductor diodes connected between the bases of said transistors, said diodes connected in series opposition and having a junction point therebetween;

a modulating signal source connected to the junction point between said diodes, said semiconductor diodes coupling directly said modulating signal source to the bases of said transistors;

a first bias means connected across the bases and emitters of said transistors;

a second bias means connected across the collectors and bases of said transistors, said first bias means forward biasing said semiconductor diodes into conduction by the base-to-emitter currents of said transistors;

an output transformer having a primary and a secondary, the primary of said transformer connected across the emitters of said transistors; and a transistor impedance converter connected across the secondary of said transformer.

References Cited by the Examiner

UNITED STATES PATENTS

| | | | |
|---|---|---|---|
| 2,900,606 | 8/59 | Faulkner | 331—113 |
| 3,020,493 | 2/62 | Carroll | 332—30 X |
| 3,077,567 | 2/63 | Gray | 331—113 X |
| 3,105,170 | 9/63 | Palmer | 331—113 X |

ROY LAKE, *Primary Examiner.*

ALFRED L. BRODY, *Examiner.*